(12) United States Patent
Hwang et al.

(10) Patent No.: US 11,017,930 B2
(45) Date of Patent: May 25, 2021

(54) INDUCTOR

(71) Applicant: SAMSUNG ELECTRO-MECHANICS CO., LTD., Suwon-si (KR)

(72) Inventors: Mi Sun Hwang, Suwon-si (KR); Jin Gul Hyun, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 343 days.

(21) Appl. No.: 16/114,990

(22) Filed: Aug. 28, 2018

(65) Prior Publication Data
US 2019/0244739 A1    Aug. 8, 2019

(30) Foreign Application Priority Data
Feb. 8, 2018 (KR) .................. 10-2018-0015872

(51) Int. Cl.
| | |
|---|---|
| H01F 27/29 | (2006.01) |
| H01F 17/00 | (2006.01) |
| H01F 27/28 | (2006.01) |
| H01F 41/04 | (2006.01) |
| H05K 1/16 | (2006.01) |
| H05K 3/10 | (2006.01) |
| C23C 18/16 | (2006.01) |

(52) U.S. Cl.
CPC ......... *H01F 17/0013* (2013.01); *C23C 18/16* (2013.01); *H01F 17/00* (2013.01); *H01F 27/28* (2013.01); *H01F 27/2804* (2013.01); *H01F 27/29* (2013.01); *H01F 27/292* (2013.01); *H01F 41/041* (2013.01); *H05K 1/165* (2013.01); *H05K 3/10* (2013.01); *H01F 41/042* (2013.01); *H01F 2027/2809* (2013.01)

(58) Field of Classification Search
CPC .. H01F 17/0013; H01F 17/00; H01F 27/2804; H01F 27/292; H01F 41/041; H01F 41/042; H01F 2027/2809; H01F 27/28; H01F 27/29; H01F 41/00; H05K 1/165; H05K 3/10; C23C 18/16; C23C 18/38; C23C 18/1653; C25D 5/12
See application file for complete search history.

(56) References Cited

U.S. PATENT DOCUMENTS

| | | | |
|---|---|---|---|
| 2009/0052114 A1* | 2/2009 | Motoki | H01G 4/2325 361/306.3 |
| 2017/0301453 A1* | 10/2017 | Jo | H01F 27/292 |

FOREIGN PATENT DOCUMENTS

| | | | |
|---|---|---|---|
| JP | 2001-135541 A | | 5/2001 |
| JP | 2005159064 A | * | 6/2005 |
| KR | 10-1639219 B1 | | 7/2016 |

* cited by examiner

*Primary Examiner* — Tuyen T Nguyen
(74) *Attorney, Agent, or Firm* — Morgan, Lewis & Bockius LLP

(57) ABSTRACT

An inductor includes a body structure, a first external electrode and a second external electrode disposed externally on the body structure and spaced apart from each other, and a conductive structure disposed inside the body structure and including a first end portion in contact with the first external electrode and a second end portion in contact with the second external electrode, wherein each of the first and second external electrodes includes an electroless plated layer and an electrolytic plated layer formed of a material different from that of the electroless plated layer and covering the electroless plated layer.

20 Claims, 8 Drawing Sheets

INDUCTOR

CROSS-REFERENCE TO RELATED APPLICATION

This application claims the benefit of priority to Korean Patent Application No. 10-2018-0015872 filed on Feb. 8, 2018 in the Korean Intellectual Property Office, the disclosure of which is incorporated herein by reference in its entirety.

TECHNICAL FIELD

The present disclosure relates to an inductor, and more particularly, to an inductor including external electrodes and a method of forming the same.

BACKGROUND

Inductors are used in electronic devices such as digital TVs, mobile phones, notebook computers, and the like. In recent years, as electronic devices have tended to be reduced in size and thickness, smaller inductors are required for electronic devices.

SUMMARY

An aspect of the present disclosure may provide a compact inductor.

An aspect of the present disclosure may also provide a method of forming a compact inductor.

According to an aspect of the present disclosure, an inductor may include: a body structure; a first external electrode and a second external electrode disposed externally on the body structure and spaced apart from each other; and a conductive structure disposed inside the body structure and including a first end portion in contact with the first external electrode and a second end portion in contact with the second external electrode, wherein each of the first and second external electrodes includes an electroless plated layer and an electrolytic plated layer, the electrolytic plated layer being formed of a material different from a material of the electroless plated layer and covering the electroless plated layer.

According to another aspect of the present disclosure, an inductor may include: a body structure; a first external electrode and a second external electrode disposed externally on the body structure and spaced apart from each other; and a conductive structure disposed inside the body structure and including a first end portion in contact with the first external electrode and a second end portion in contact with the second external electrode, wherein each of the first and second external electrodes includes a first plated layer having a first thickness, a second plated layer covering the first plated layer and having a second thickness, and a third plated layer covering the second plated layer and having a third thickness, and the second thickness is greater than the first thickness.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described in detail with reference to the accompanying drawings.

The term 'electroless plated layer' as used herein may refer to a plated layer formed through electroless plating, and the term 'electrolytic plated layer' may refer to a plated layer formed through electroplating.

Figure 1:
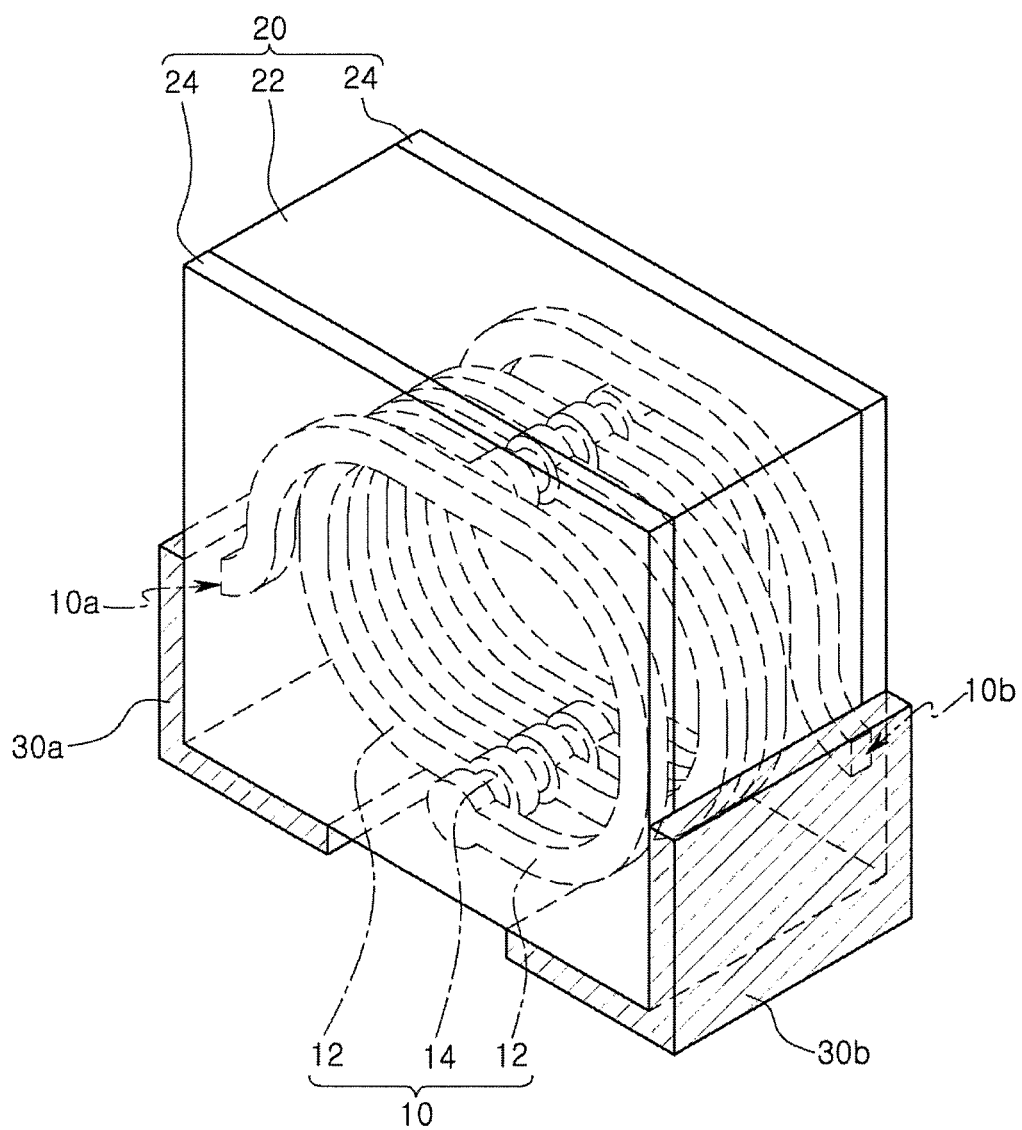
FIG. 1 is a perspective view illustrating an inductor according to an exemplary embodiment in the present disclosure.

First, an inductor according to an exemplary embodiment in the present disclosure will be described with reference to FIGS. 1 and 2. FIG. 1 is a perspective view illustrating an inductor according to an exemplary embodiment in the present disclosure, and FIG. 2 is a cross-sectional view illustrating a partial region of FIG. 1.

Figure 2:
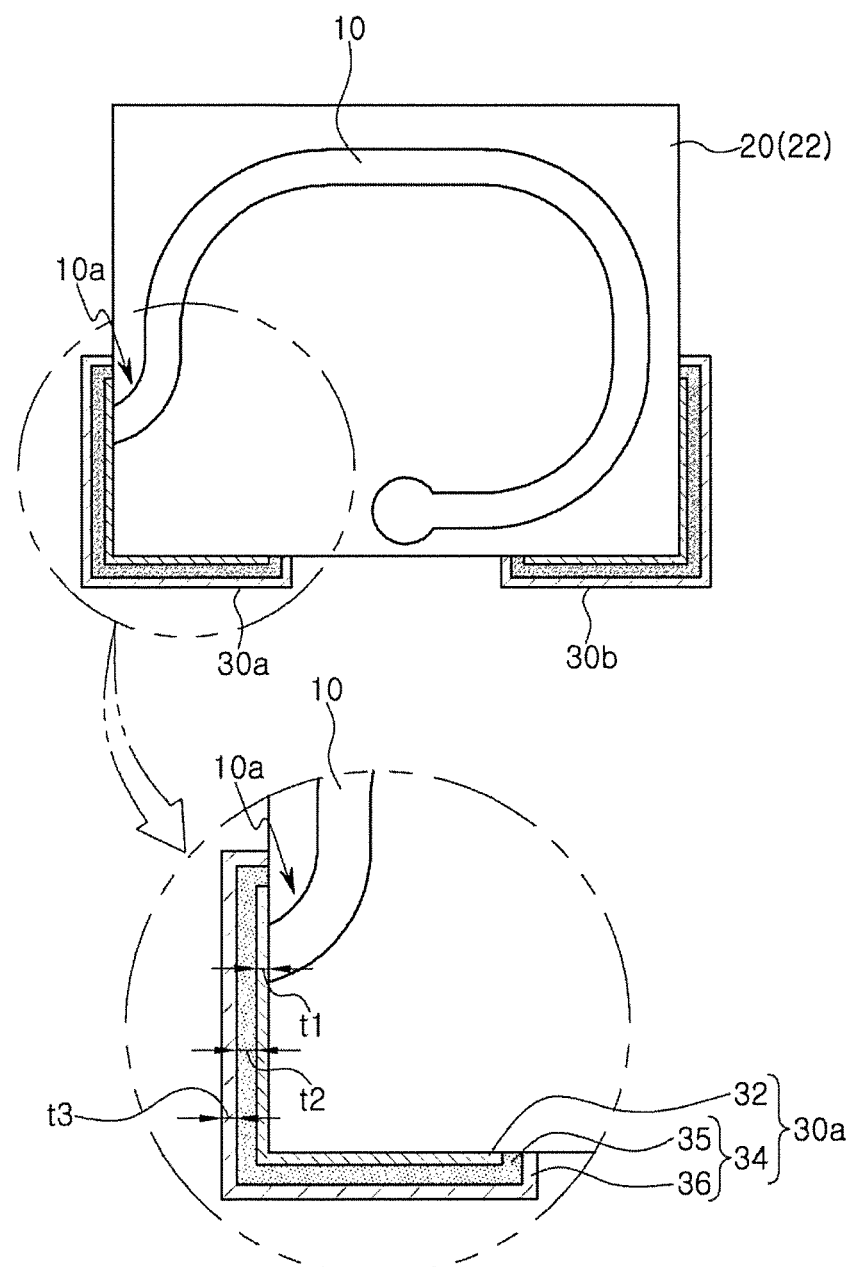
FIG. 2 is a cross-sectional view illustrating an inductor according to an exemplary embodiment in the present disclosure.

Referring to FIGS. 1 and 2, an inductor according to an exemplary embodiment in the present disclosure may include a body structure 20, a conductive structure 10, and external electrodes 30a and 30b.

The body structure 20 may be formed of an insulating material. For example, the body structure 20 may be formed using resin and silica.

The body structure 20 may include an inner body 22 and outer bodies 24 disposed on both sides of the inner body 22. The outer bodies 24 may include the same material as that of the inner body 22. The outer bodies 24 may have rigidity different from that of the inner body 22. For example, the outer bodies 24 and the inner body 22 may have different rigidities according to the content of a material (e.g., silica, etc.) included in the resin and/or type of the resin. For example, the outer bodies 24 may have rigidity higher than that of the inner body 22.

The external electrodes 30a and 30b may include a first external electrode 30a and a second external electrode 30b disposed externally on the body structure 20 and spaced apart from each other.

The conductive structure 10 may be disposed inside the body structure 20. The conductive structure 10 may include a conductive material such as copper (Cu), aluminum (Al), silver (Ag), tin (Sn), gold (Au), nickel (Ni), lead (Pb) or an alloy thereof.

The conductive structure 10 may include a first end portion 10a in contact with the first external electrode 30a and a second end portion 10b in contact with the second external electrode 30b.

In an example, the conductive structure 10 may include a plurality of conductive patterns 12 and connection vias 14 connecting the plurality of conductive patterns 12 to each other.

In an example, the conductive structure 10 may include a copper material by electrolytic plating.

Each of the first and second external electrodes 30a and 30b may include an electroless plated layer 32 and an electrolytic plated layer 34 covering the electroless plated layer 32.

The first end portion 10a of the conductive structure 10 may be in contact with the electroless plated layer 32 of the first external electrode 30a and the second end portion 10b of the conductive structure 10 may be in contact with the electroless plated layer 32 of the second external electrode 30b.

The electrolytic plated layer 34 may include an inner electrolytic plated layer 35 covering the electroless plated layer 32 and an outer electrolytic plated layer 36 covering the inner electrolytic plated layer 35.

In an example, the inner electrolytic plated layer 35 may be formed of a material having rigidity higher than that of the electroless plated layer 32. For example, the electroless plated layer 32 may be formed of copper (Cu), and the inner electrolytic plated layer 35 may be formed of nickel (Ni).

In an example, the outer electrolytic plated layer 36 may be formed of tin (Sn).

In an example, the electroless plated layer 32 may have a first thickness t1, the inner electrolytic plated layer 34 may have a second thickness t2, and the outer electrolytic plated layer 36 may have a third thickness t3.

In an example, the second thickness t2 of the inner electrolytic plated layer 35 may be greater than the first thickness t1 of the electroless plated layer 32.

In an example, the second thickness t2 of the inner electrolytic plated layer 35 may be greater than the third thickness t3 of the outer electrolytic plated layer 36.

In an example, the third thickness t3 of the outer electrolytic plated layer 36 may be greater than the first thickness t1 of the electroless plated layer 32.

In an example, the electroless plated layer 32 may have a thickness of about 0.3 μm to about 2 μm, the inner electrolytic plated layer 35 may have a thickness of about 8 μm, and the outer electrolytic plated layer 36 may have a thickness of about 5 μm.

In an example, the electroless plated layer 32 may be referred to as a 'first plated layer', the inner electrolytic plated layer 35 may be referred to as a 'second plated layer', and the outer electrolytic plated layer 36 may be referred to as a 'third plated layer'.

In an example, each of the first and second external electrodes 30a and 30b may be formed on two adjacent side surfaces of the body structure 20, and the first and second external electrodes 30a and 30b may be formed on any one of the two adjacent side surfaces of the body structure 20.

Figure 3:
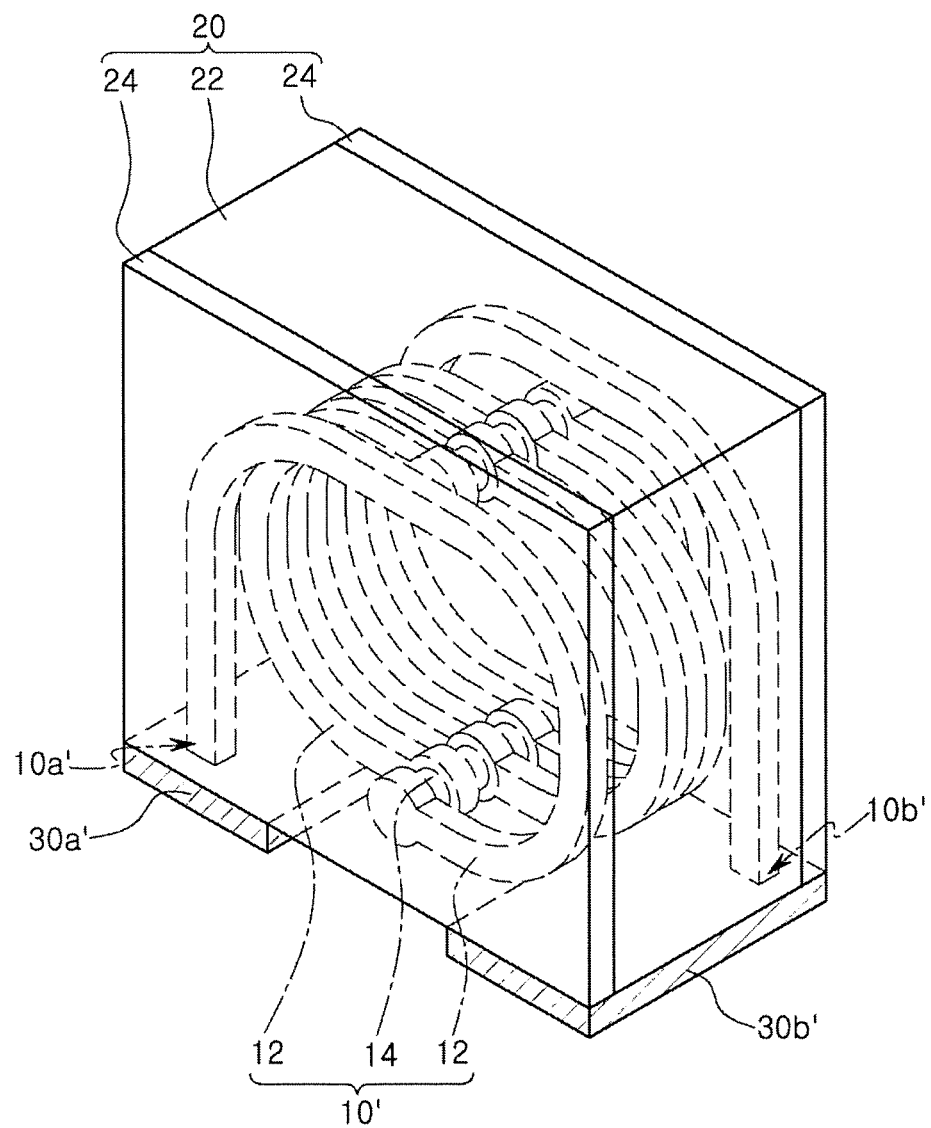
FIG. 3 is a perspective view illustrating a modification of the inductor according to an exemplary embodiment in the present disclosure.

In an example, each of the first and second external electrodes 30a and 30b may have an L shape, but the technical concept of the present disclosure is not limited thereto and may be modified into various shapes. Hereinafter, a modification of the inductor according to an exemplary embodiment in the present disclosure will be described with reference to FIGS. 3 and 4. FIG. 3 is a perspective view illustrating a modification of the inductor according to an exemplary embodiment in the present disclosure, and FIG. 4 is a cross-sectional view illustrating a partial region of FIG. 3.

Figure 4:
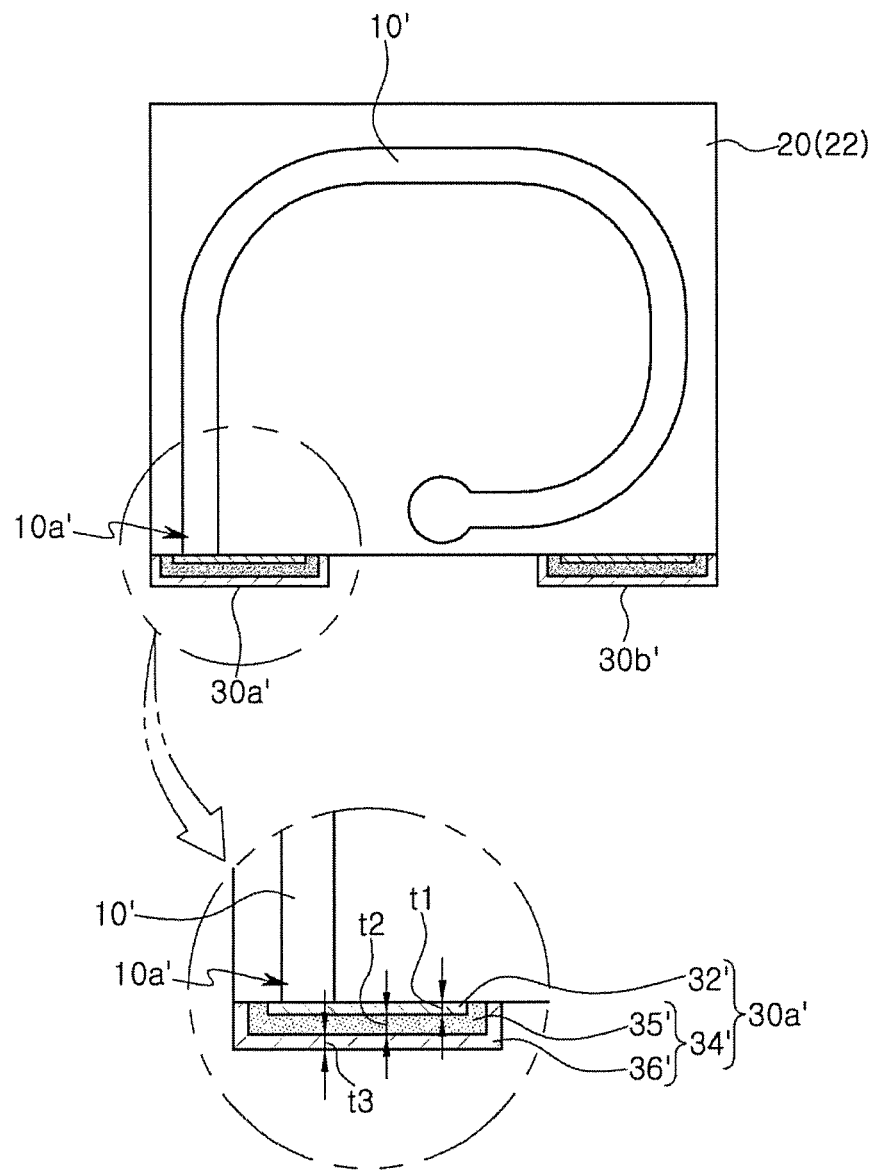
FIG. 4 is a cross-sectional view illustrating a modification of the inductor according to an exemplary embodiment in the present disclosure.

Referring to FIGS. 3 and 4, first and second external electrodes 30a' and 30b' may be disposed on any one side surface of the body structure 20 and spaced apart from each other. Each of the first and second external electrodes 30a' and 30b' may have a substantially flat plate shape of the body structure 20.

Each of the first and second external electrodes 30a' and 30b' may include a flat electroless plated layer 32' and an electrolytic plated layer 34' covering the electroless plated layer 32'. The electrolytic plated layer 34' may include an inner electrolytic plated layer 35' covering the electroless plated layer 32' and an outer electrolytic plated layer 36' covering the inner electrolytic plated layer 35'.

The electroless plated layer 32', the inner electrolytic plated layer 35', and the outer electrolytic plated layer 36' may correspond to the electroless plated layer 32 having the first thickness t1, the inner electrolytic plated layer 35 having the second thickness t2, the outer electrolytic plated layer 35 having the third thickness t3 described above with reference to FIGS. 1 and 2, respectively. Therefore, the electroless plated layer 32' may have the first thickness t1, the inner electrolytic plated layer 35' may have the second thickness t2 greater than the first thickness t1, and the outer electrolytic plated layer 36' may have the third thickness t3 greater than the first thickness t1 and smaller than the second thickness t2.

A conductive structure 10', which may be disposed in the body structure 20, may have a first end portion 10a' in contact with the electroless plated layer 32' of the first external electrode 30a' and a second end portion 10b' in contact with the electroless plated layer 32' of the second external electrode 30b'.

Figure 5:
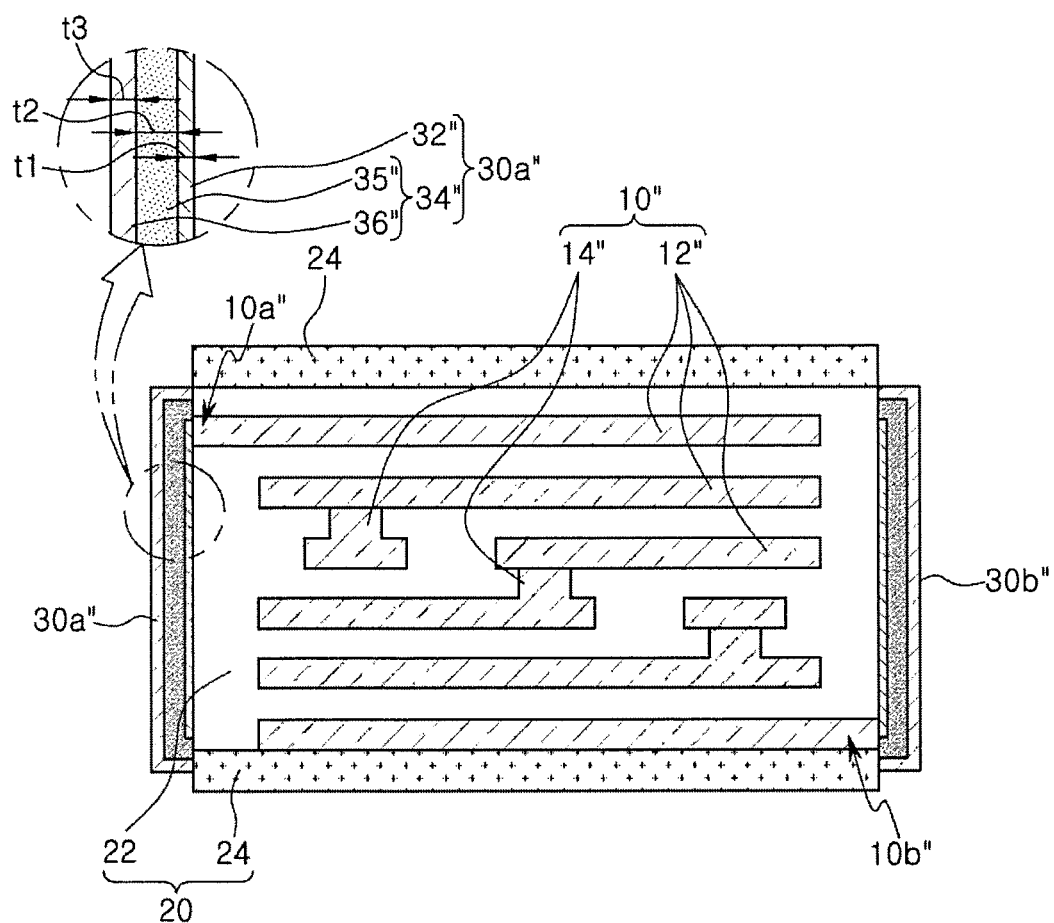
FIG. 5 is a cross-sectional view illustrating a modification of the inductor according to an exemplary embodiment in the present disclosure.

The first and second external electrodes 30a' and 30b' may be disposed on any one side of the body structure 20, but the technical concept of the present disclosure is not limited thereto and the first and second external electrodes 30a' and 30b' may be varied. Hereinafter, an example of the inductor including modified external electrodes will be described with reference to FIG. 5. FIG. 5 is a cross-sectional view illustrating a modification of the inductor according to an exemplary embodiment in the present disclosure.

In a modification, referring to FIG. 5, a body structure 20 may be disposed. The body structure 20 may include the inner body 22 and the outer bodies 24 disposed on both sides of the inner body 22 as described above with reference to FIGS. 1 and 2.

The conductive structure 10" may be disposed inside the body structure 20. The conductive structure 10" may include a plurality of conductive patterns 12" and connection vias 14" connecting the plurality of conductive patterns 12".

First and second external electrodes 30a" and 30b" may be disposed on both sides of the body structure 20 opposing each other.

Each of the first and second external electrodes 30a" and 30b" may include an electroless plated layer 32" and an electrolytic plated layer 34" covering the electroless plated layer 32". The electrolytic plated layer 34" may include an inner electrolytic plated layer 35" covering the electroless plated layer 32" and an outer electrolytic plated layer 36" covering the inner electrolytic plated layer 35".

The electroless plated layer 32", the inner electrolytic plated layer 35", and the outer electrolytic plated layer 36" may correspond to the electroless plated layer 32 having the first thickness t1, the inner electrolytic plated layer 35 having the second thickness t2, and the outer electrolytic plated layer 36 having the third thickness t3 described above with reference to FIGS. 1 and 2, respectively. Thus, the electroless plated layer 32" may have the first thickness t1, the inner electrolytic plated layer 35" may have the second thickness t2 greater than the first thickness t1, and the outer electrolytic plated layer 36" may have the third thickness t3 greater than the first thickness t1 and smaller than the second thickness t2.

The conductive structure 10" may include a first end portion 10a" in contact with the inner electrolytic plated layer 35" of the first external electrode 30a" and a second end portion 10b" in contact with the inner electrolytic plated layer 35" of the second external electrode 30b".

Figure 6:
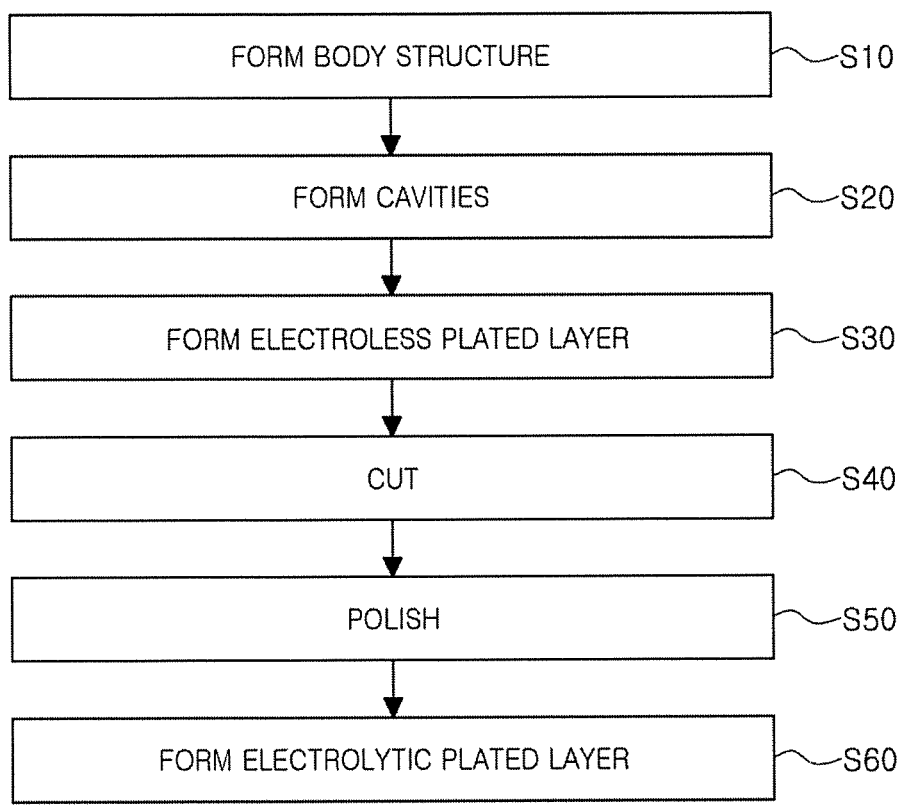
FIG. 6 is a flowchart illustrating an example of a method of forming an inductor according to an exemplary embodiment in the present disclosure.

Next, an example of a method of forming an inductor according to an exemplary embodiment in the present disclosure will be described with reference to FIGS. 6 to 10. FIG. 6 is a flowchart illustrating an example of a method of forming an inductor according to an exemplary embodiment in the present disclosure and FIGS. 7 through 10 are perspective views illustrating an example of a method of forming an inductor according to an exemplary embodiment in the present disclosure.

Figure 7:
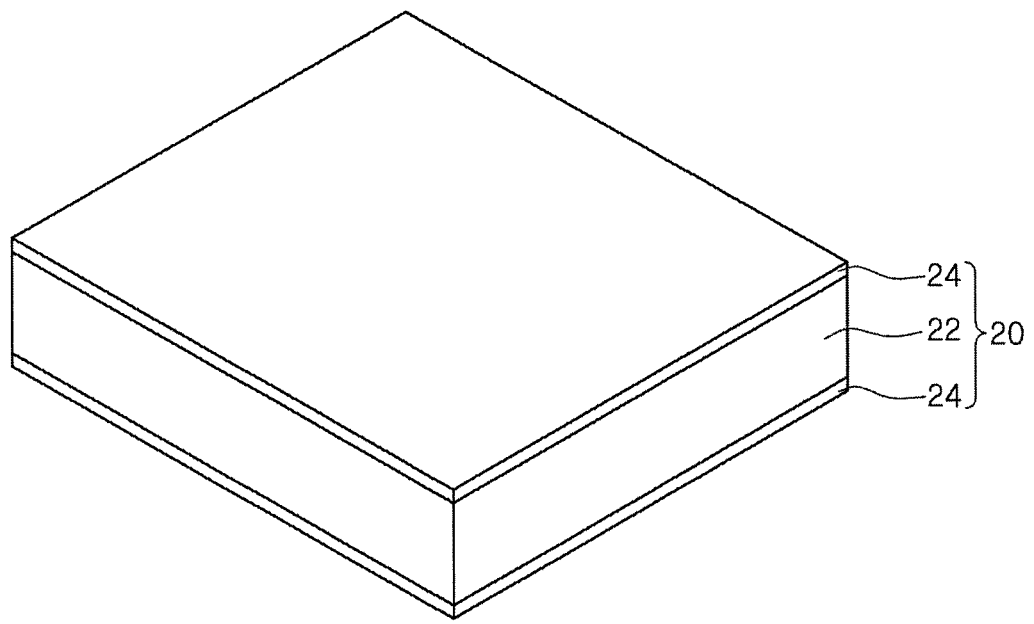
FIGS. 7 through 10 are perspective views illustrating an example of a method of forming an inductor according to an exemplary embodiment in the present disclosure.

Referring to FIGS. 6 and 7, a body structure 20 may be formed in operation S10. The body structure 20 may include an inner body 22 and outer bodies 24 disposed on both sides of the inner body 22. A plurality of conductive structures may be formed inside the body structure 20.

Each of the plurality of conductive structures may be any one of the conductive structure (10 of FIGS. 1 and 2) which is the same as that described above with reference to FIGS. 1 and 2, the conductive structure (10' of FIGS. 3 and 4) which is the same as that described above with reference to FIGS. 3 and 4, and the conductive structure (10" of FIG. 5) which is the same as that described above with reference to FIG. 5.

Figure 8:
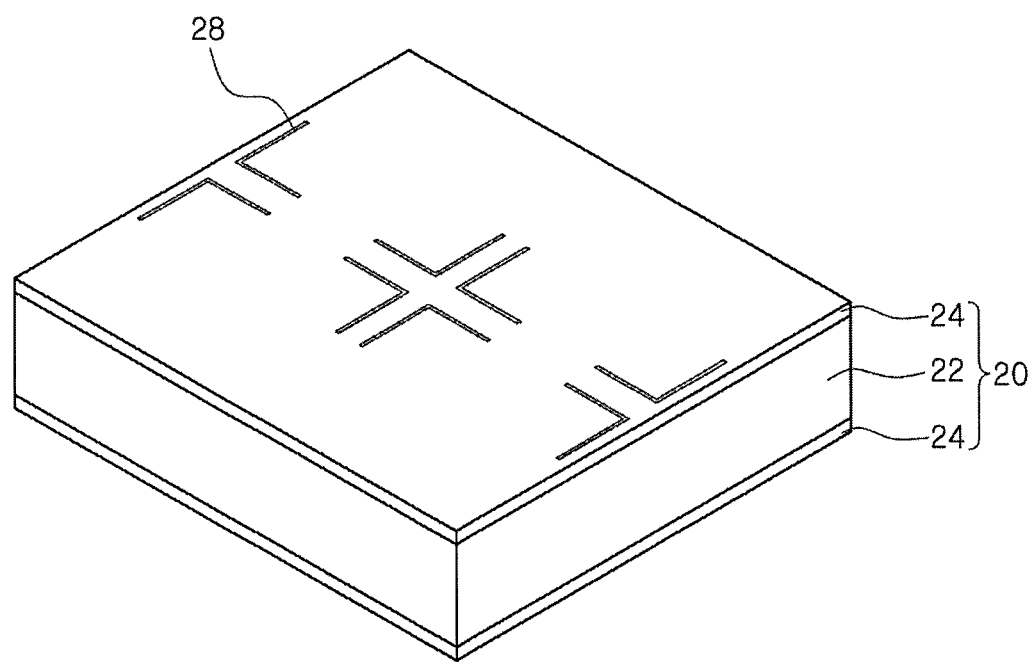

Referring to FIGS. 6 and 8, cavities 28 may be formed in operation S20. The cavities 28 may penetrate through the body structure 20.

In an example, the cavities 28 may have a shape corresponding to the shapes of the first and second external electrodes 30a and 30b described above with reference to FIGS. 1 and 2, but the technical concept of the present disclosure is not limited thereto. For example, the cavities 28 may have a shape corresponding to the shape of the first and second external electrodes 30a' and 30b' described above with reference to FIGS. 3 and 4 or a shape corresponding to the shapes of the first and second external electrodes 30a" and 30b" described above with reference to FIG. 5.

Figure 9:
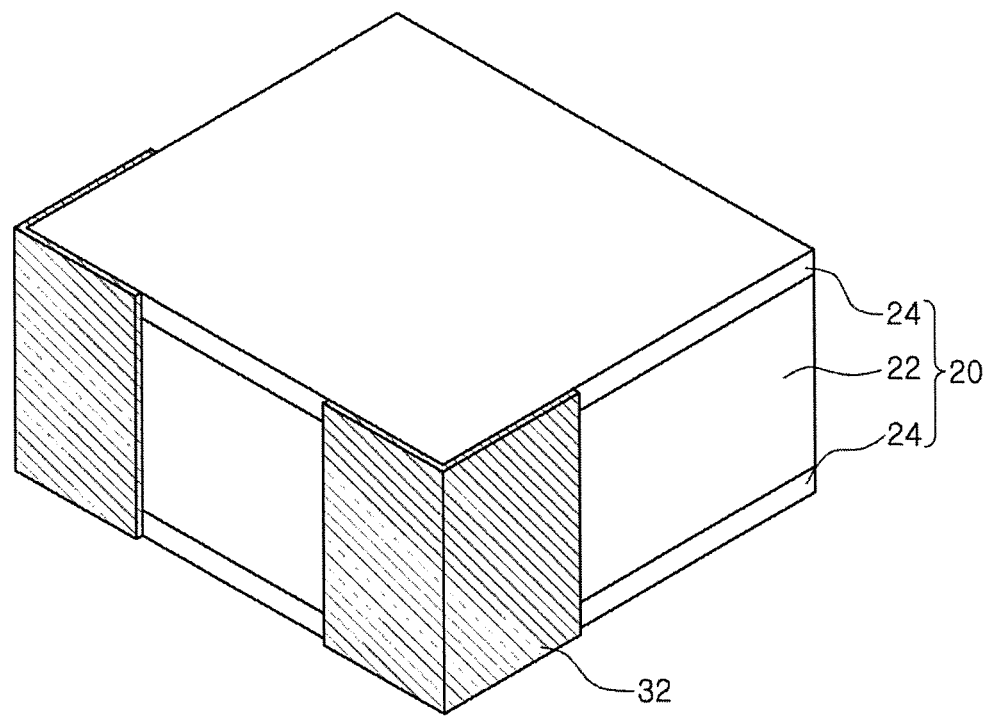

Referring to FIGS. 6, 8, and 9, an electroless plated layer 32 may be formed in operation S30. The electroless plated layer 32 may be formed on a surface of the body structure 20 on which the cavities 28 are formed. The electroless plated layer 32 may be formed of copper by an electroless plating method.

Cutting may be performed in operation S40. The body structure 20 may be divided into a plurality of portions by the cutting. FIG. 8 is a perspective view illustrating a state before the body structure 20 is divided, and FIG. 9 is a perspective view illustrating any one body structure 20 after the body structure 20 is divided into a plurality of portions. The electroless plated layer 32 may remain after the cutting operation S40.

Thereafter, polishing may be performed in operation S50. The polishing may be an operation of polishing a surface of the body structures 20 which have been divided into parts.

Figure 10:
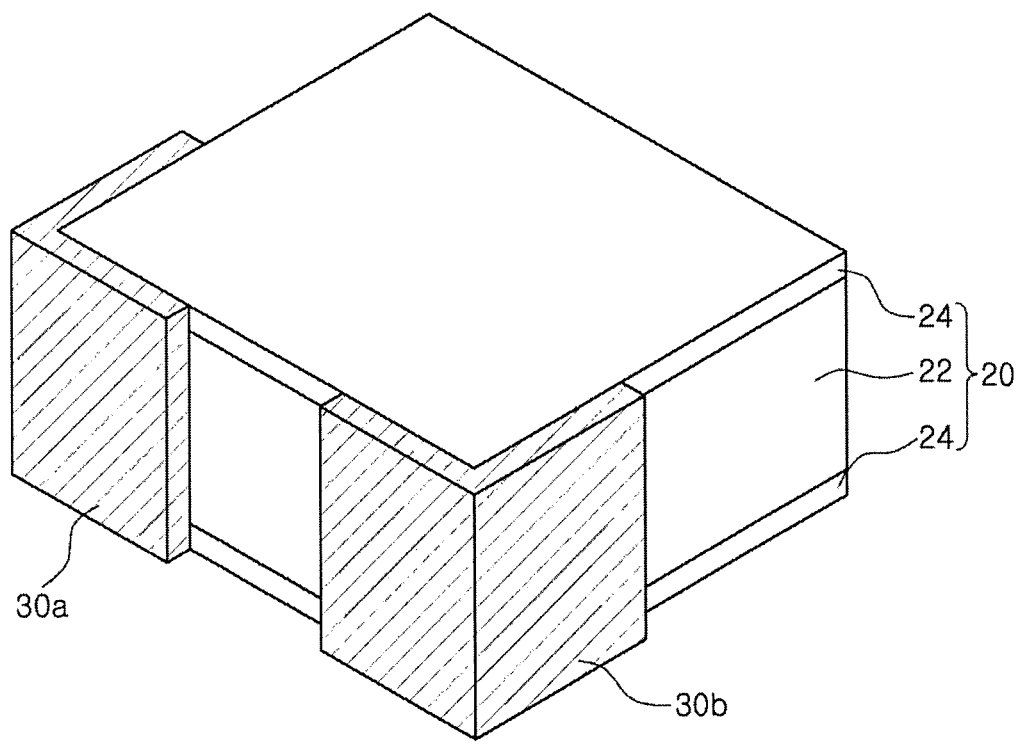

Referring to FIGS. 1 and 2 together with FIGS. 6 and 10, an electrolytic plated layer 34 may be formed in operation S60. The electrolytic plated layer 34 may include the inner electrolytic plated layer 35 covering the electroless plated layer 32 and an outer plated layer 36 covering the inner electrolytic plated layer 35. Accordingly, the external electrodes 30a and 30b including the electroless plated layer 32 and the electrolytic plated layer 34 may be formed.

According to exemplary embodiments, the electrolytic plated layer 34 may be formed using electroplating using the electroless plated layer 32, which is formed outside the body structure 20, as a seed layer. Thus, electroplating used to form the external electrodes 30a and 30b may be performed using the electroless plated layer 32 formed outside the body structure as a seed layer, rather than using a part of the conductive structure 10 in the body structure 20 as a seed layer. Accordingly, since the conductive structure 10 formed inside the body structure 20 is formed without a seed layer for electroplating, an internal area of the conductive structure 10 formed inside the body structure 20 may be increased, which may result in an increase of an inductance value of the inductor. Therefore, according to the exemplary embodiments of the present disclosure, a high-capacity inductor may be provided. Further, according to the exemplary embodiments of the present disclosure, an inductor that may be miniaturized without decreasing capacity thereof may be provided.

According to the exemplary embodiments, since parasitic capacitance between the conductive structure 10 and the external electrodes 30a and 30b is minimized, a Q value of the inductor may be improved.

According to exemplary embodiments, forming the external electrodes 30a and 30b may include forming the cavities 28, forming the electroless plated layer 32 having a relatively smaller thickness, performing cutting, and subsequently forming the electrolytic plated layer 34. By forming the external electrodes 30a and 30b as described above, the external electrodes 30a and 30b may be realized to have a uniform shape. In addition, as described above, forming the external electrodes 30a and 30b as described above may prevent cracks from occurring in the body structure 20. Also, since the external electrodes 30a and 30b are formed as described above, forming a seed layer in the body structure 20 may be omitted, and thus, the conductive structure 10 and the body structure 20 may be uniformly formed and reliability of the inductor may be improved.

According to the exemplary embodiments, the inner electrolytic plated layer 35 may be formed of a material having rigidity higher than that of the electroless plated layer 32 and may be formed thicker than the electroless plated layer 32. Therefore, since the inner electrolytic plated layer 35 having a relatively high rigidity is formed to be relatively thick, rigidity of the inductor may further be increased.

As set forth above, according to exemplary embodiments of the present disclosure, it is possible to provide an inductor which may be miniaturized without reducing capacity thereof and a method of forming the same.

Various and advantageous advantages and effects of the present disclosure are not limited to the above description and may be more easily understood in the course of describing a specific exemplary embodiment in the present disclosure.

While exemplary embodiments have been shown and described above, it will be apparent to those skilled in the art that modifications and variations could be made without departing from the scope of the present disclosure as defined by the appended claims.

What is claimed is:
1. An inductor comprising:
a body structure;

a first external electrode and a second external electrode disposed externally on the body structure and spaced apart from each other; and a conductive structure disposed inside the body structure and including a first end portion in contact with the first external electrode, a first coil portion extending from the first end portion, a second end portion in contact with the second external electrode, and a second coil portion extending from the second end portion, wherein each of the first and second external electrodes includes an electro less plated layer and an electrolytic plated layer, the electrolytic plated layer being formed of a material different from a material of the electroless plated layer and covering the electroless plated layer, and wherein the first coil portion has a substantially same width as that of the first end portion, and the second coil portion has a substantially same width as that of the second end portion.

2. The inductor of claim 1, wherein the electrolytic plated layer includes an inner electrolytic plated layer covering the electroless plated layer and an outer electrolytic plated layer covering the inner electrolytic plated layer.

3. The inductor of claim 2, wherein the inner electrolytic plated layer has rigidity higher than rigidity of the electro less plated layer.

4. The inductor of claim 2, wherein the electroless plated layer has a first thickness, wherein the inner electrolytic plated layer has a second thickness, wherein the outer electrolytic plated layer has a third thickness, and wherein the second thickness is greater than the first thickness.

5. The inductor of claim 4, wherein the third thickness is greater than the first thickness.

6. The inductor of claim 4, wherein the second thickness is greater than the third thickness.

7. The inductor of claim 1, wherein the first end portion of the conductive structure is in contact with the electro less plated layer of the first external electrode and the second end portion of the conductive structure is in contact with the electroless plated layer of the second external electrode.

8. The inductor of claim 1, wherein both of the first and second external electrodes are disposed on one surface of the body structure.

9. The inductor of claim 8, wherein the first and second external electrodes extend from the one surface of the body structure to both side surfaces of the body structure opposing each other.

10. The inductor of claim 1, wherein the first and second external electrodes are disposed on both side surfaces of the body structure opposing each other.

11. The inductor of claim 1, wherein the body structure includes an inner body and outer bodies disposed on both sides of the inner body and having rigidity higher than rigidity of the inner body, and wherein the inner body includes the conductive structure disposed between the outer bodies.

12. The inductor of claim 1, wherein the electroless plated layer is formed of copper (Cu), the inner electrolytic plated layer is formed of nickel (Ni), and the outer electrolytic plated layer is formed of tin (Sn).

13. The inductor of claim 1, wherein the conductive structure includes a plurality of conductive patterns and connection vias connecting the plurality of conductive patterns to each other.

14. An inductor comprising:

a body structure;

a first external electrode and a second external electrode disposed externally on the body structure and spaced apart from each other; and a conductive structure disposed inside the body structure in a lamination direction and including a first end portion in contact with the first external electrode and a second end portion in contact with the second external electrode, wherein each of the first and second external electrodes includes a first plated layer having a first thickness, a second plated layer covering the first plated layer and having a second thickness, and a third plated layer covering the second plated layer and having a third thickness, wherein the second thickness is greater than the first thickness, and wherein the body structure includes opposing surfaces in the lamination direction which are devoid of the first and second external electrodes.

15. The inductor of claim 14, wherein the second plated layer is formed of a material having rigidity higher than that of the first plated layer.

16. The inductor of claim 14, wherein the first plated layer is an electroless plated layer, and wherein the second and third plated layers are electrolytic plated layers.

17. The inductor of claim 16, wherein the first plated layer is formed of copper (Cu) through electroless plating, wherein the second plated layer is formed of nickel (Ni) through electroplating, and wherein the third plated layer is formed of tin (Sn) through electroplating.

18. The inductor of claim 14, wherein the second thickness is greater than the third thickness, and wherein the third thickness is greater than the first thickness.

19. The inductor of claim 1, wherein the conductive structure is disposed inside the body structure in a lamination direction, and wherein the body structure includes opposing surfaces in the lamination direction which are devoid of the first and second external electrodes.

20. The inductor of claim 14, wherein the conductive structure further includes a first coil portion extending from the first end portion and a second coil portion extending from the second end portion, and wherein the first coil portion has a substantially same width as that of the first end portion and the second coil portion has a substantially same width as that of the second end portion.

* * * * *